US009613976B2

(12) United States Patent
Shimojo et al.

(10) Patent No.: US 9,613,976 B2
(45) Date of Patent: Apr. 4, 2017

(54) THREE-DIMENSIONAL SEMICONDUCTOR MEMORY DEVICE

(71) Applicant: Kabushiki Kaisha Toshiba, Minato-ku (JP)

(72) Inventors: Yoshiro Shimojo, Yokkaichi (JP); Masaru Kito, Kuwana (JP); Yoshihiro Yanai, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/657,235

(22) Filed: Mar. 13, 2015

(65) Prior Publication Data

US 2016/0071875 A1    Mar. 10, 2016

Related U.S. Application Data

(60) Provisional application No. 62/046,271, filed on Sep. 5, 2014.

(51) Int. Cl.
*H01L 29/76*     (2006.01)
*H01L 27/11582*  (2017.01)
*H01L 27/11565*  (2017.01)

(52) U.S. Cl.
CPC .. *H01L 27/11582* (2013.01); *H01L 27/11565* (2013.01)

(58) Field of Classification Search
CPC ......... H01L 2924/0002; H01L 2924/00; H01L 27/11582; H01L 23/5226; H01L 27/11519; H01L 23/53295; H01L 27/11524; H01L 27/11578; H01L 27/11521; H01L 29/792; H01L 27/1157; H01L 21/76831; H01L 21/76847; H01L 21/76877; H01L 21/76897; H01L 27/10
USPC .......... 257/E27.103, E21.679, E23.141, 314, 257/E21.655, E21.657, 774, 324; 438/128, 591; 365/185.17, 185.05, 365/185.24, 174
See application file for complete search history.

(56) References Cited

U.S. PATENT DOCUMENTS

| | | | |
|---|---|---|---|
| 7,851,914 B2 | 12/2010 | Masukawa et al. | |
| 8,154,068 B2 | 4/2012 | Katsumata et al. | |
| 8,198,670 B2 | 6/2012 | Aoyama | |
| 2010/0109072 A1* | 5/2010 | Kidoh | H01L 27/0688 257/324 |
| 2010/0171162 A1* | 7/2010 | Katsumata | H01L 27/0688 257/314 |
| 2010/0202206 A1 | 8/2010 | Seol et al. | |

(Continued)

*Primary Examiner* — Lex Malsawma
*Assistant Examiner* — Nduka Ojeh
(74) *Attorney, Agent, or Firm* — Oblon, McClelland, Maier & Neustadt, L.L.P.

(57) ABSTRACT

In general, according to one embodiment, a semiconductor memory device includes a substrate, a stacked body, a semiconductor pillar, a memory film, a partitioning member, a first interlayer insulating film, and a first plug. The stacked body is provided on the substrate, and including a plurality of electrode films and a plurality of insulating films. The semiconductor pillar is provided in the stacked body. The partitioning member is provided in the stacked body. The first plug is connected to the semiconductor pillar. A central axis of the first plug is shifted from a central axis of the semiconductor pillar so as to approach the nearest partitioning member.

22 Claims, 8 Drawing Sheets

(56) References Cited

U.S. PATENT DOCUMENTS

2014/0284738 A1* 9/2014 Nakazawa ............ H01L 27/228
              257/421
2015/0372101 A1* 12/2015 Lee ................... H01L 29/41775
              257/314

* cited by examiner

THREE-DIMENSIONAL SEMICONDUCTOR MEMORY DEVICE

CROSS-REFERENCE TO RELATED APPLICATIONS

This application is based upon and claims the benefit of priority from U.S. Provisional Patent Application 62/046,271, filed on Sep. 5, 2014; the entire contents of which are incorporated herein by reference.

FIELD

Embodiments described herein relate generally to a semiconductor memory device.

BACKGROUND

Recently, a BiCS (Bit Cost Scalable) that is a next generation type NAND flash memory is developed. The BiCS is fabricated by stacking memory cells in a multistage form in a three-dimensional direction. In the BiCS, densification of the cells still remains as a matter to be settled. Although it is conceivable to dispose memory holes in a staggered form in order to densify the cells, in this case, there is formed a part where a distance between adjacent plugs becomes considerably short. As a result, there is such a disadvantage that a bit line capacitance of that part is considerably increased.

DETAILED DESCRIPTION

In general, according to one embodiment, a semiconductor memory device includes a substrate, a stacked body, a semiconductor pillar, a memory film, a partitioning member, a first interlayer insulating film, and a first plug. The stacked body is provided on the substrate, and including a plurality of electrode films and a plurality of insulating films, each of the plurality of electrode films and each of the plurality of insulating films being alternately stacked. The semiconductor pillar is provided in the stacked body. The memory film is provided between the semiconductor pillar and the plurality of electrode films. The partitioning member is provided in the stacked body. The first interlayer insulating film is provided on the stacked body. The first plug is provided in the first interlayer insulating film. The first plug is connected to the semiconductor pillar. A central axis of the first plug is shifted from a central axis of the semiconductor pillar so as to approach the nearest partitioning member.

Embodiments of the invention will now be described with reference to the drawings.

First Embodiment

First, a first embodiment will be described.

Figure 1:
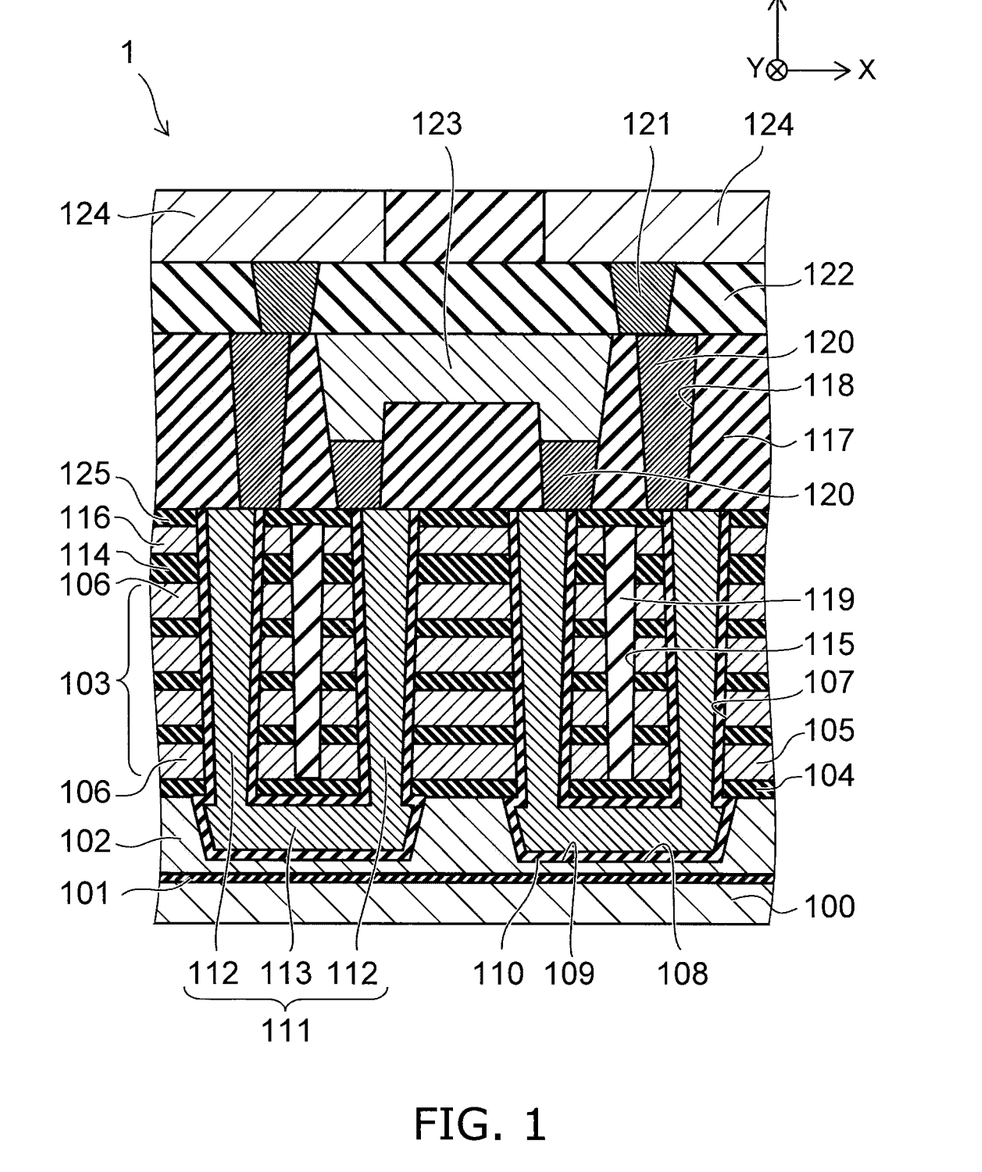
FIG. 1 is a sectional diagram illustrating a semiconductor memory device according to a first embodiment.

FIG. 1 is a sectional diagram illustrating a semiconductor memory device according to the first embodiment.

Figure 2:
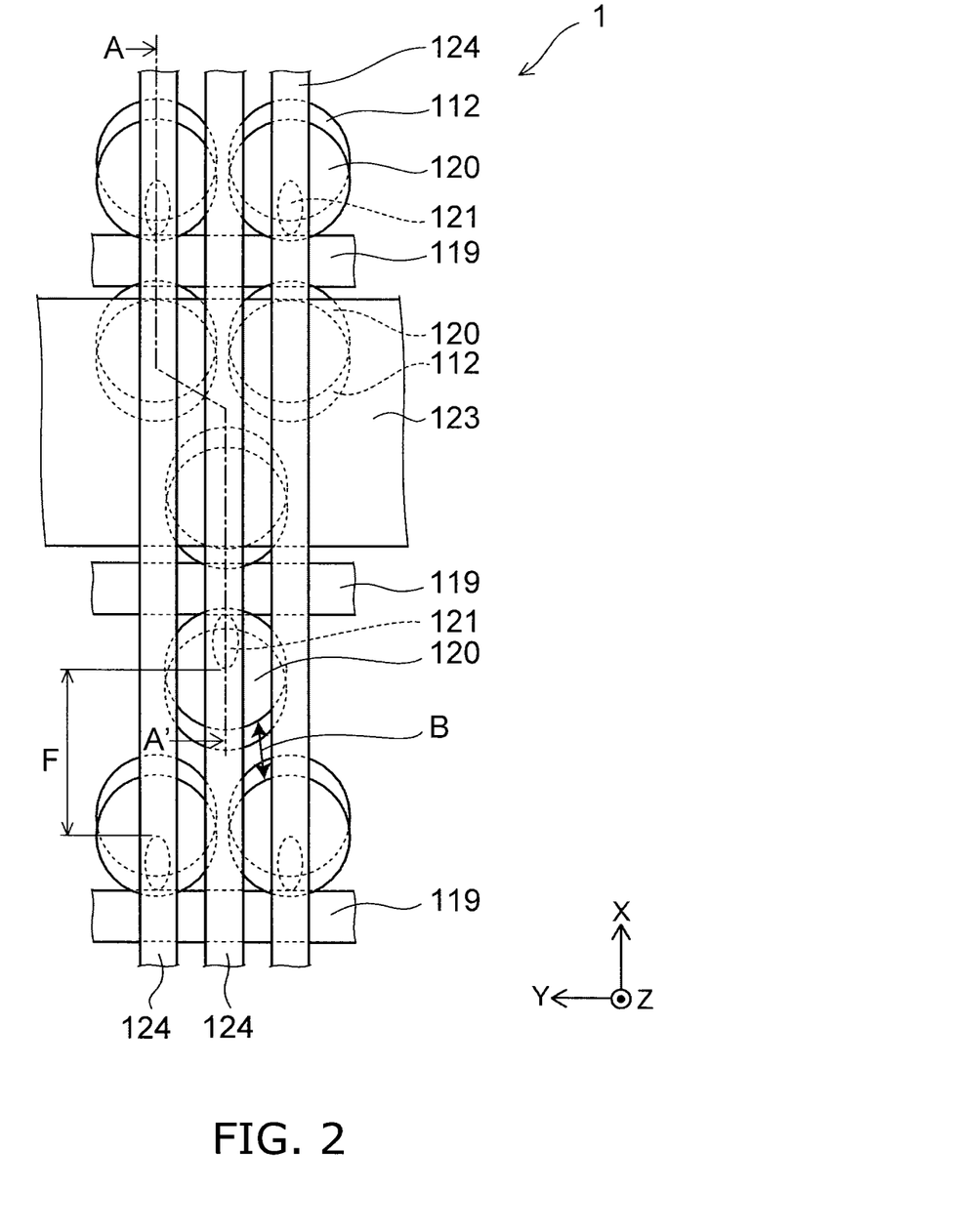
FIG. 2 is an upper surface view illustrating the semiconductor memory device according to the first embodiment.

FIG. 2 is an upper surface view illustrating the semiconductor memory device according to the first embodiment.

FIG. 1 shows the sectional diagram taken along an A-A' line in FIG. 2.

As shown in FIG. 1, in a semiconductor memory device 1 according to the embodiment, a silicon substrate 100 is provided.

In the following, in the specification, an XYZ orthogonal coordinate system will be introduced for convenience of description.

In the coordinate system, two directions that are parallel with a major surface of the silicon substrate 100 shown in FIG. 1 and orthogonal to each other are referred to as an X-axis direction and a Y-axis direction, and a direction that is orthogonal to both of the X-axis direction and the Y-axis direction is referred to as a Z-axis direction.

On the silicon substrate 100, a back gate insulating film 101 and a back gate electrode film 102 are provided. On the back gate electrode film 102, a stacked body 103 is provided. In the stacked body 103, a plurality of insulating films 104 and a plurality of electrode films 105 are alternately stacked. Each electrode film 105 is divided along the X-axis direction into a plurality of control gate electrodes 106.

In the stacked body 103, a memory hole 107 is formed so as to extend in the Z-axis direction and penetrate through the stacked body 103.

In an upper part of the back gate electrode film 102, a recessed part 108 is formed, and each memory hole 107 penetrates through the control gate electrode 106 at each stage and reaches the recessed part 108. The two memory holes 107 are individually brought into communication with both end parts of the same recessed part 108. One pair of the memory holes 107 and the recessed part 108 that brings the memory holes 107 into communication with each other configure one continuous U-shaped hole 109.

On an inner face of the U-shaped hole 109, a memory film 110 is contiguously and seamlessly provided. In the memory film 110, a block insulating film that is made of, for example, a silicon oxide, a charge storage film that is made of, for example, a silicon nitride and a tunnel insulating film that is made of, for example, a silicon oxide are stacked in order starting from the outside. The block insulating film is a film that does not substantially allow a current to flow even when a voltage is applied within a range of a drive voltage of the semiconductor memory device 1. The charge storage film is a film having a charge retaining capability. The tunnel insulating film is a film that allows a tunnel current to flow when a predetermined voltage within the range of the drive voltage of the semiconductor memory device 1 is applied, though the tunnel insulating film is generally insulating.

In addition, in the U-shaped hole 109, an impurity-doped semiconductor material, for example, polysilicon is embedded. Thereby, a U-shaped pillar 111 is provided in the U-shaped hole 109. A part of the U-shaped pillar 111 that is located in the memory hole 107 configures a semiconductor pillar 112 and a part of the U-shaped pillar 111 that is located in the recessed part 108 configures a connection member 113. The semiconductor pillar 112 is in the form of a pillar that extends in the Z-axis direction, for example, in the form of a column. In addition, the connection member 113 is in the form of a rectangular parallelepiped that defines the X-axis direction as a longitudinal direction. Further, the U-shaped pillar 111 is insulated from the back gate electrode film 102 and the control gate electrode 106 by the memory film 110.

An upper surface of the stacked body 103 is covered with an interlayer insulating film 114. In addition, on the upper surface of the stacked body 103 and on the interlayer insulating film 114, a plurality of line-shaped conductive films 116 that extend in the Y-axis direction are provided. Further, on the conductive film 116, an insulating film 125 is provided.

Further, as shown in FIG. 1 and FIG. 2, between the two memory holes 107 that form the U-shaped pillar 111, a slit 115 is formed so as to extend in the Y-axis direction. The slit 115 is formed so as to divide the interlayer insulating film 114, the stacked body 103 and the conductive film 116. In the slit, an insulating member 119 is provided as a partitioning member. That is, the insulating member 119 is provided in the interlayer insulating film 114, the stacked body 103 and the conductive film 116.

On the conductive film 116, an interlayer insulating film 117 is provided. In addition, on the semiconductor pillar 112, a contact hole 118 is formed. The contact hole 118 is shifted from a central axis of an area right above the semiconductor pillar 112 so as to approach the nearest insulating member 119. The insulating member 119 is not provided in the interlayer insulating film 117. As shown in FIG. 1, the contact hole 118 is in communication with the memory hole 107. In the contact hole 118, a plug 120 is embedded.

In an upper part of the interlayer insulating film 117, a source line 123 is embedded and is electrically connected to one of a pair of the semiconductor pillars 112 that configures the U-shaped pillar 111 via the plug 120. Further, on the interlayer insulating film 117, an interlayer insulating film 122 is provided. In the interlayer insulating film 122, a contact plug 121 is embedded. As shown in FIG. 2, the contact plug 121 is embedded in a position shifted from the central axis of an area right above the plug 120 that is not connected to the source line 123 toward an inner-side direction of the U-shaped pillar 111, and the plug 120 is in contact with the contact plug 121. The contact plug 121 is in the form of, example, an elliptical frustum and is smaller in size than the plug 120.

On the interlayer insulating film 122, a plurality of bit lines 124 that extend in the X-axis direction are provided. The bit line 124 is connected to the semiconductor pillar 112 that is not connected to the source line 123 of one pair of the semiconductor pillars 112 that configures each U-shaped pillar 111 via the plug 120 and the contact plug 121. Accordingly, the U-shaped pillar 111 is connected between the source line 123 and the bit line 124.

Next, with reference to FIG. 2, a positional relation among the semiconductor pillar 112, the plug 120, the contact plug 121, the source line 123 and the insulating member 119 provided in the slit 115 in the embodiment will be described.

As shown in FIG. 2, the plurality of semiconductor pillars 112 are provided between the two insulating members 119 that are mutually adjacent in the X-axis direction. The individual semiconductor pillars 112 are disposed in two lines along the Y-axis direction and the semiconductor pillars 112 are out of phase with each other by an approximately ½ period between the semiconductor pillars in two lines, that is, are disposed in a one-line and two-strand staggered arrangement.

The "staggered arrangement" and "arranged in a staggered form" mean arrangements shown in the following. That is, in a case where an R-strand staggered arrangement (R: a repeating unit of the staggered arrangements) has been conceived, one arbitrary integer is designated from integers that are not less than 0 and not more than (R−1) as a variable r. At that time, an arrangement that the semiconductor pillars 112 that are located on an (Rn−r)-th (n: an integer not less than 1) place stand in a line in the form of a straight line that extends in the Y-axis direction is the R-strand staggered arrangement. In addition, an arrangement that in a case where a straight line that is bent in a serrated zigzag form is drawn centering on a line that extends in the X-axis direction, the semiconductor pillars 112 are located on corners of the straight line is the R-strand staggered arrangement. At that time, for example, an arrangement in a case where the number of lines that the semiconductor pillars are arranged linearly along the Y-axis direction is two (a case where the repeating unit: R is two) will be called a two-strand staggered arrangement, and an arrangement in a case where the number of lines that the semiconductor pillars are linearly arranged along the Y-axis direction is four (a case where the repeating unit: R is 4) will be called a four-strand staggered arrangement.

A central axis of the plug 120 is located at a position shifted toward the nearest insulating member 119 side with respect to a central axis of the semiconductor pillar 112 to which the plug 120 is connected when viewed from the Z-axis direction. That is, a distance between two plugs 120 nipping the insulating member 119 is shorter than a distance between two semiconductor pillars 112 corresponding each of the plugs 120. However, the plug 120 is not shifted to such an extent that the plug 120 is separated from the semiconductor pillar 112 and part of the plug 120 overlaps part of the semiconductor pillar 112 when viewed from the Z-axis direction. In addition, a central axis of the contact plug 121 is located at a position shifted toward the nearest insulating member 119 side with respect to the central axis of the plug 120 when viewed from the Z-axis direction. However, the entire of the contact plug 121 overlaps the part of the plug 120 when viewed from the Z-axis direction.

Next, advantageous effects of the embodiment will be described with reference to FIG. 2.

As shown in FIG. 2, in the semiconductor memory device according to the embodiment, the position of the plug 120 is shifted from the position of the semiconductor pillar 112 toward the insulating member 119 side. Therefore, a minimum distance between the plugs 120 shown by an arrow B becomes longer than a case of not shifting the plug 120. Accordingly, a parasitic capacitance between the plugs 120 is decreased by shifting the plug 120. It is possible to evaluate the parasitic capacitance between the plugs 120 by measuring a capacitance between the bit lines 124.

In addition, in a region between the two adjacent insulating members 119, when m (m is an integer not less than 2) is a number of the semiconductor pillars 121 arranged in the X-axis direction and F is a pitch, it is possible to increase a pitch between the plugs 120 in the X-axis direction up to [F(m+1)/m].

That is, in the case of the example, it is possible to increase the pitch in the X-axis direction between the plugs 120 provided on each semiconductor pillar 112 up to 1.5F.

In addition, it is possible to dispose the contact plug 121 by shifting the contact plug 121 within a range that contact with the plug 120 is maintained.

According to the embodiment, it is possible to promote miniaturization of the semiconductor memory device 1 while suppressing the parasitic capacitance between the plugs 120 in this way.

Comparative Example of the First Embodiment

Next, a comparative example of the first embodiment will be described.

Figure 3:
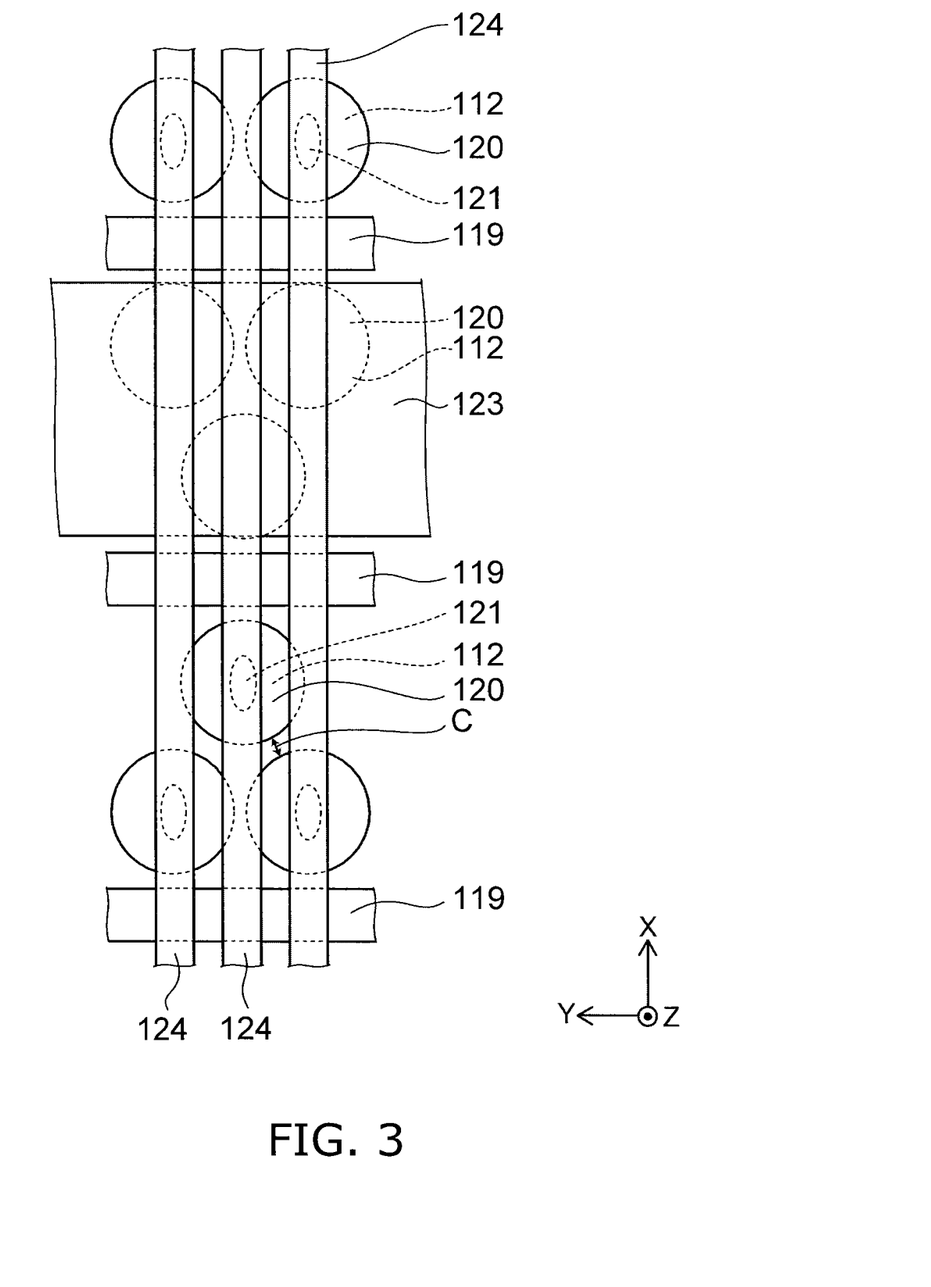
FIG. 3 is an upper surface view illustrating a semiconductor memory device according to a comparative example.

FIG. 3 is an upper surface view illustrating a semiconductor memory device according to the comparative example.

As shown in FIG. 3, in the semiconductor memory device according to the comparative example, the plug 120 and the contact plug 121 are provided in the area right above the semiconductor pillar 112. The semiconductor pillar 112, the plug 120 and the contact plug 121 are connected together without shifting their central axes. In a case of the comparative example, there exists a section that a distance between the plugs 120 is short as shown by an arrow C. In this case, the parasitic capacitance between the plugs 120 is increased. Configurations other than the positions of the plug 120 and the contact plug 121 of the semiconductor memory device of the comparative example are the same as the configurations of the semiconductor memory device 1 of the first embodiment.

Second Embodiment

Next, a second embodiment will be described.

Figure 4:
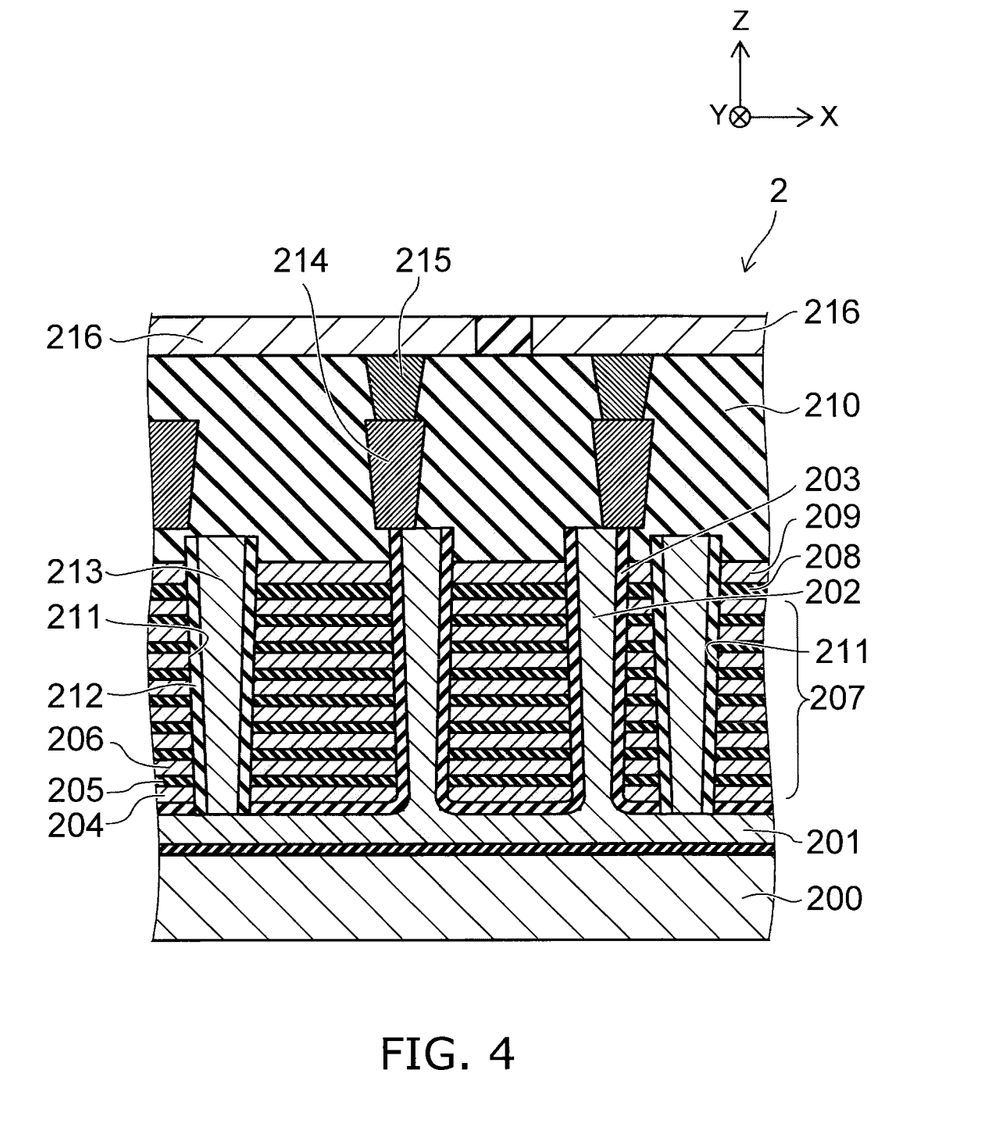
FIG. 4 is a sectional diagram illustrating a semiconductor memory device according to a second embodiment.

FIG. 4 is a sectional diagram illustrating a semiconductor memory device according to the second embodiment.

Figure 5:
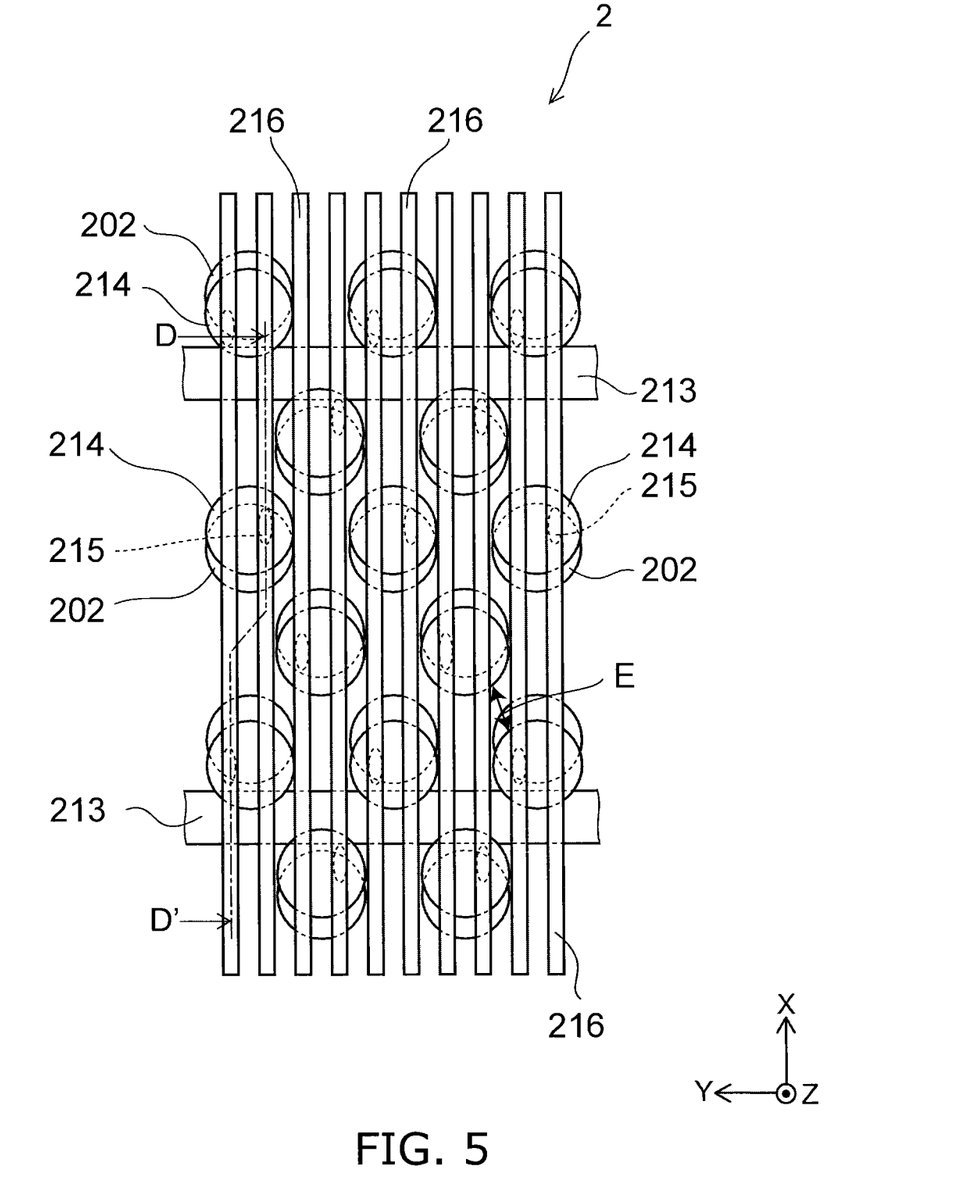
FIG. 5 is an upper surface view illustrating the semiconductor memory device according to the second embodiment.

FIG. 5 is an upper surface view illustrating the semiconductor memory device according to the second embodiment.

FIG. 4 shows the sectional diagram taken along a D-D' line in FIG. 5.

As shown in FIG. 4, in a semiconductor memory device 2 according to the embodiment, a silicon substrate 200 is provided. On the silicon substrate 200, a connection member 201 and a semiconductor pillar 202 are formed by, for example, polysilicon. Then, on an outer face of a structure that includes the connection member 201 and the semiconductor pillar 202, an insulating memory film 203 is provided. On the connection member 201, a selection gate electrode film 204 is provided with the memory film 203 interposed therebetween. Further, on the selection gate electrode film 204, a stacked body 207 that a control gate electrode film 205 and an interlayer insulating film 206 are alternately arranged is provided. On the control gate electrode film 204 that is the uppermost layer of the stacked body 207, an interlayer insulating film 208 is provided, on the interlayer insulating film 208, a selection gate electrode film 209 is provided, and on the selection gate electrode film 209, an interlayer insulating film 210 is provided. The semiconductor pillar 202 is formed so as to penetrate through the selection gate electrode film 209, the interlayer insulating film 210, the stacked body 207 and the selection gate electrode film 204 and reach the connection member 201. The semiconductor pillar 202 is insulated from a selection gate electrode film 204, the control gate electrode film 206 and the selection gate electrode film 209 by the memory film 205, and a slit 211 is formed so as to divide the selection gate electrode film 204, the interlayer insulating film 208, the stacked body 207, and the selection gate electrode film 209.

On an inner face of the slit 211, a side wall insulating film 212 is formed. In the slit 211, a source line 213 is provided as a partitioning member. That is, the source line 213 is provided in the interlayer insulating film 208, the stacked body 207 and the selection gate electrode film 209.

As shown in FIG. 5, a plurality of the semiconductor pillars 202 are provided between the two source lines 213 that are adjacent to each other in the X-axis direction and are disposed in a two-strand and two-line staggered arrangement in the Y-axis direction.

As shown in FIG. 4 and FIG. 5, on the semiconductor pillar 202, a plug 214 is provided. A central axis of the plug 214 is disposed by being shifted so as to approach the nearest source line 213, with respect to a central axis of the semiconductor pillar 202 to which the plug 214 is connected when viewed from the Z-axis direction. However, the plug 214 is not shifted to such an extent that the plug 214 is separated from the semiconductor pillar 202 and part of the plug 214 overlaps the semiconductor pillar 202 when viewed from the Z-axis direction. At that time, in a case where F is a pitch of the semiconductor pillars 202 in the X-axis direction, the plug 214 is shifted such that a pitch in the X-axis direction between the plugs 214 provided on the semiconductor pillar 202 amounts to 1.25F at a maximum. That is, a distance between two plugs 214 nipping the source line 213 is shorter than a distance between two semiconductor pillars 202 corresponding each of the plugs 214.

Further, on the plug 214, a contact plug 215 is provided. The contact plug 215 is in the form of an elliptical frustum and is smaller in size than the plug 214. A longitudinal direction of the contact plug 215 is the X-axis direction when viewed from the Z-axis direction.

On the plug 214, two bit lines 216 that extend in the X-axis direction are provided. The plug 214 is electrically connected with one of the two bit lines 216 via the contact plug 215. Thereby, each bit line 216 is connected to one semiconductor pillar 203 via one contact plug 215 and one plug 214.

Next, advantageous effects of the embodiment will be described with reference to FIG. 5.

As shown in FIG. 5, in the semiconductor memory device 2 according to the embodiment, the position of the plug 214 is shifted from the position of the semiconductor pillar 202 toward the nearest source line 213 side. Thus, a distance between the plugs 214 that is shown by, for example, an arrow E in FIG. 5 is increased. Thereby, the parasitic capacitance between the plugs 214 is decreased.

Comparative Example of the Second Embodiment

Next, a comparative example of the second embodiment will be described.

Figure 6:
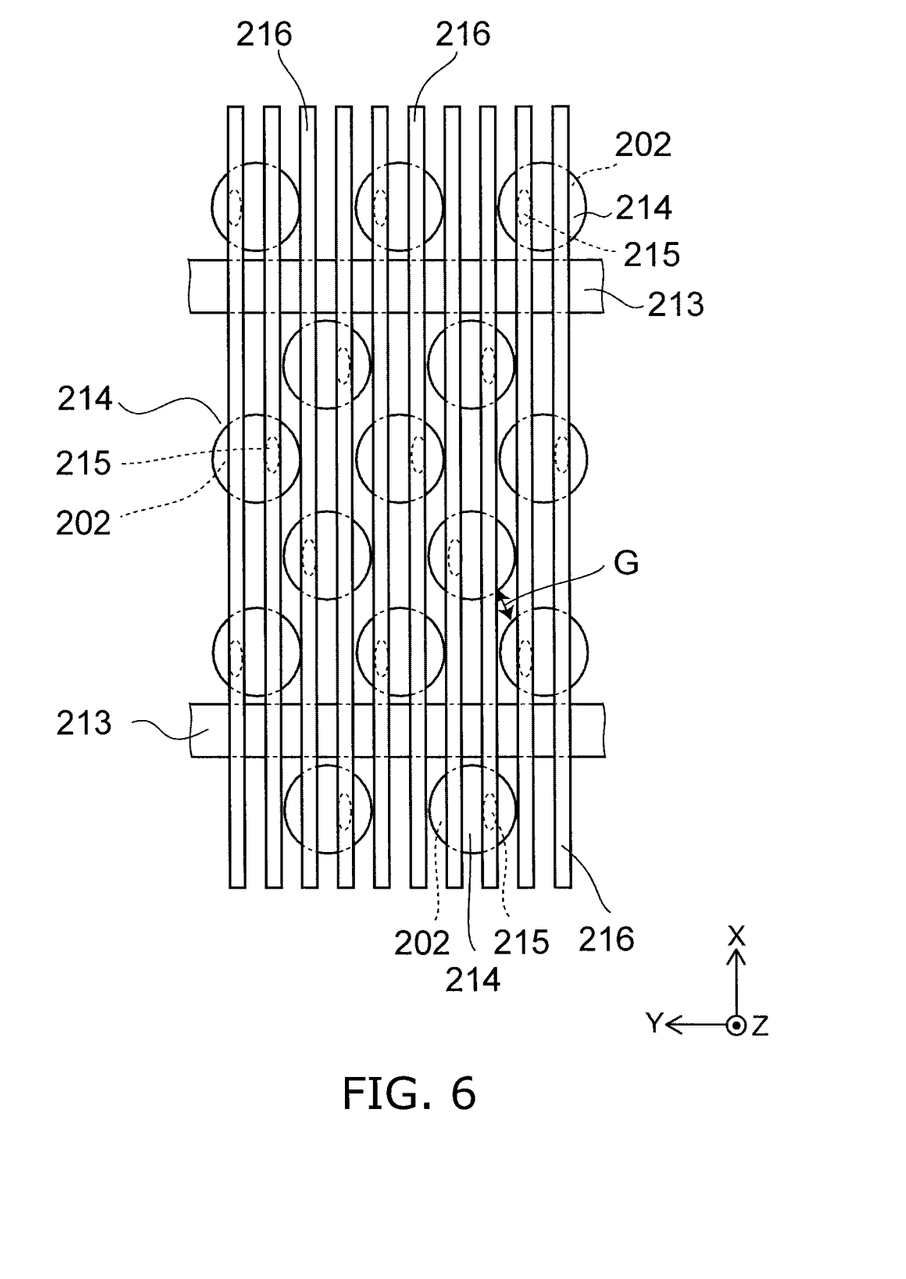
FIG. 6 is an upper surface view illustrating a semiconductor memory device according to the comparative example.

FIG. 6 is an upper surface view illustrating a semiconductor memory device according to the comparative example.

As shown in FIG. 6, in the semiconductor memory device according to the comparative example, a connection position of the plug 214 is not shifted from the central axis of the semiconductor pillar 202. In a case of the comparative example, there exists a section that a distance between the contact plugs 215 is short as shown by an arrow G. Thus, the parasitic capacitance between the contact plugs 215 is increased. Configurations other than the position of the plug 214 of the semiconductor memory device of the comparative example are the same as the configurations of the semiconductor memory device 2 according to the second embodiment.

Third Embodiment

Next, a third embodiment will be described.

Figure 7:
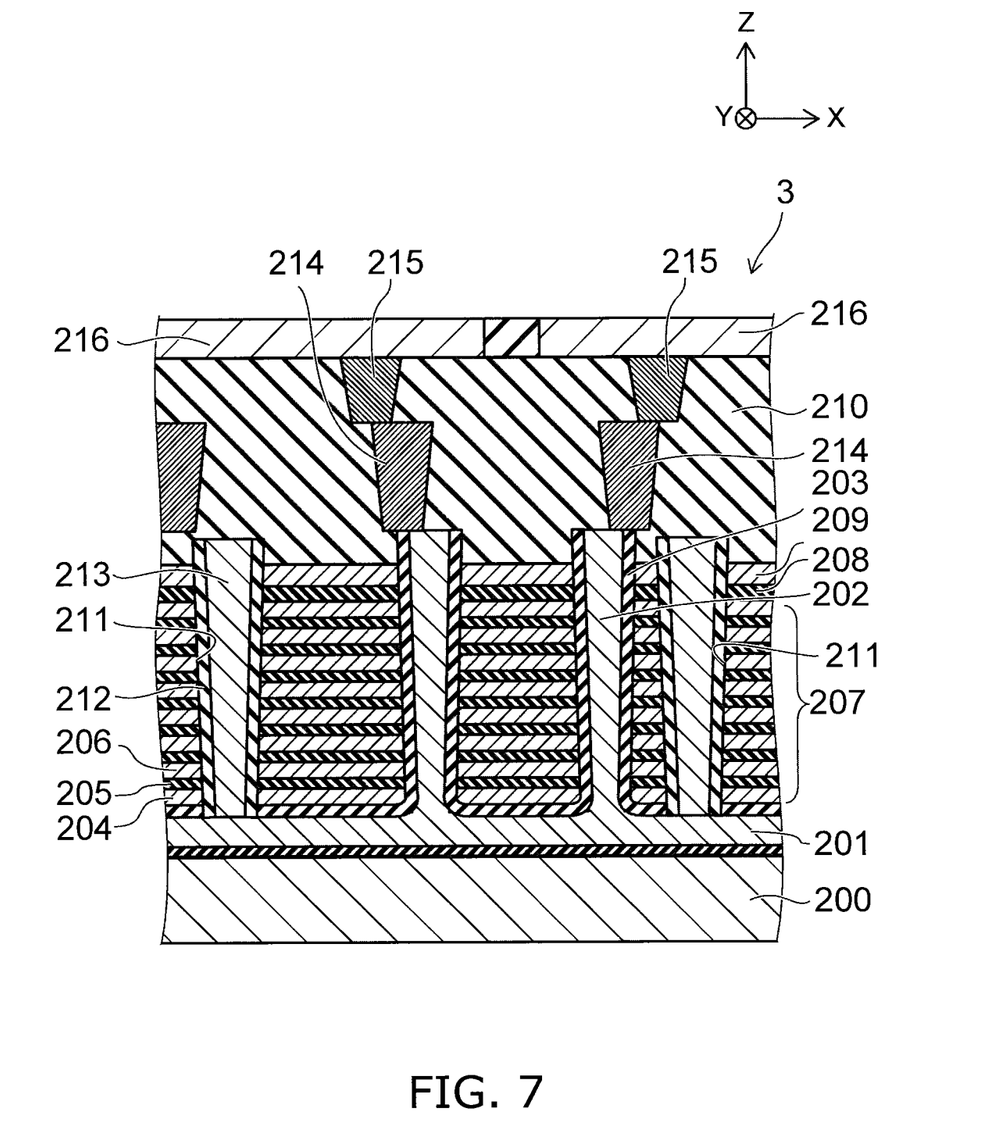
FIG. 7 is a sectional diagram illustrating a semiconductor memory device according to a third embodiment.

FIG. 7 is a sectional diagram illustrating a semiconductor memory device 3 according to the third embodiment.

Figure 8:
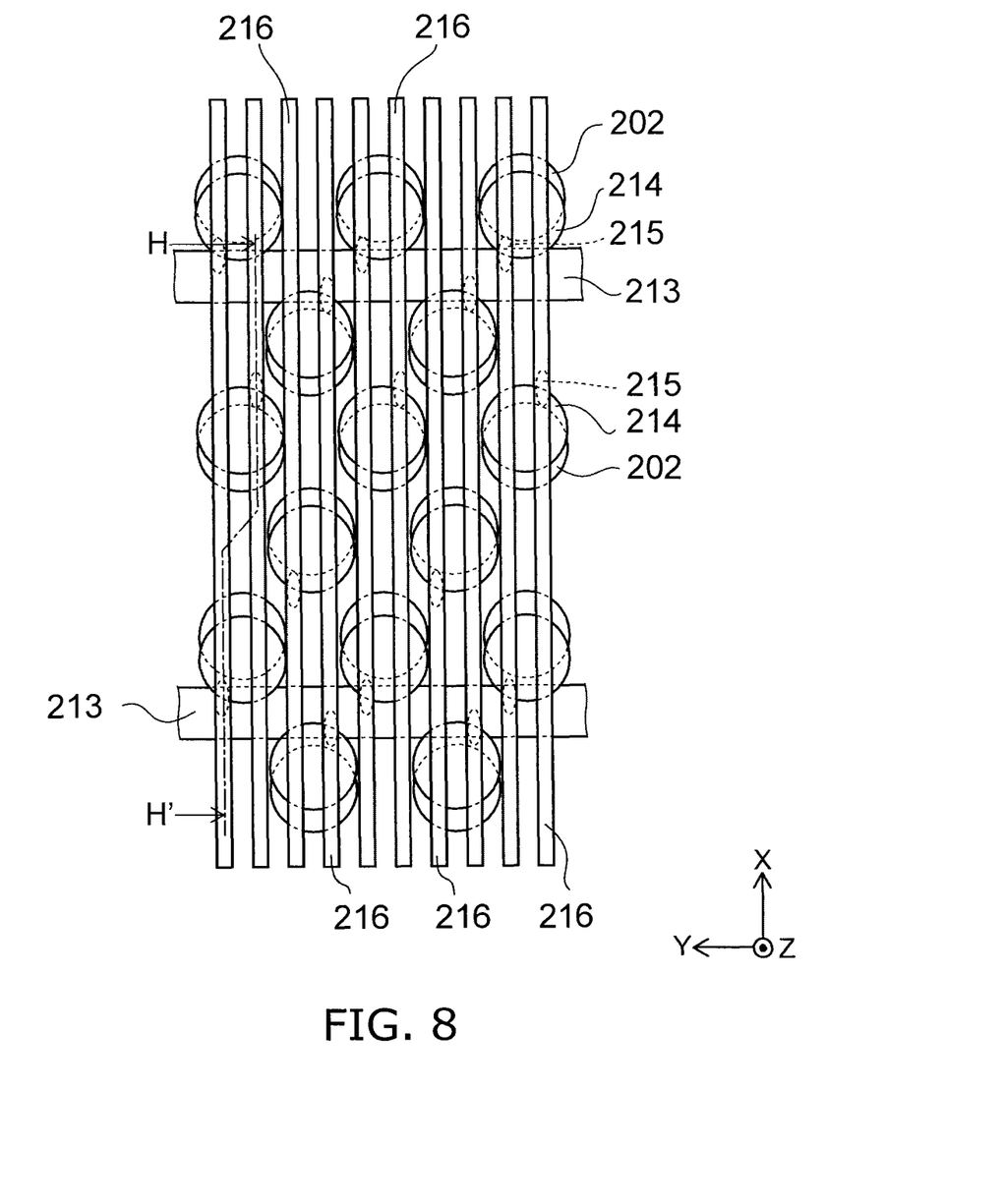
FIG. 8 is an upper surface view illustrating the semiconductor memory device according to the third embodiment.

FIG. 8 is an upper surface view illustrating the semiconductor memory device 3 according to the third embodiment.

FIG. 7 shows the sectional diagram taken along an H-H' line in FIG. 8.

In FIG. 8, constitutional elements other than the semiconductor pillar 202, the plug 214, the contact plug 215, the source line 213 and the bit line 216 are omitted.

As shown in FIG. 7 and FIG. 8, in the third embodiment, the contact plug 215 that is connected to each plug 214 is disposed at a position shifted toward the source line 213 side. The contact plug 215 is disposed by being shifted so as to approach the nearest source line 213 within a range that contact with the plug 214 is maintained. At this time, in a region between the two adjacent source lines 213, a pitch of the plugs 214 in the X-axis direction is smaller than a pitch of the contact plugs 215.

Configurations other than the position of the contact plug 215 of the semiconductor memory device of the third embodiment are the same as the configurations of the semiconductor memory device 2 according to the second embodiment.

Advantageous effects of the embodiment will be described.

A space between the contact plugs 215 is more increased by shifting the contact plug 215 so as to approach the source line 213 than would be possible in a case of not shifting the contact plug 215. Therefore, it is possible to obtain an effect of increasing an exposure margin of lithography to be performed when forming the contact plug 215. In addition, the parasitic capacitance between the contact plugs 215 is decreased owing to an increase in space between the contact plugs 215. It is possible to evaluate the parasitic capacitance between the contact plugs 215 as a capacitance between the bit lines 121.

According to the above-described embodiments, it is possible to implement the semiconductor memory device that the bit line capacitance has been decreased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
a substrate;
a stacked body provided on the substrate, and including a plurality of electrode films and a plurality of insulating films, each of the plurality of electrode films and each of the plurality of insulating films being alternately stacked along a first direction;
a semiconductor pillar provided in the stacked body, and extending in the first direction of the plurality of electrode films;
a memory film provided between the semiconductor pillar and the plurality of electrode films;
a partitioning member provided in the stacked body;
a first interlayer insulating film provided on the stacked body; and
a first plug provided in the first interlayer insulating film, the first plug being connected to the semiconductor pillar, a central axis of the first plug being shifted from a central axis of the semiconductor pillar, and
a distance between the central axis of the first plug and a central axis of a nearest partitioning member being smaller than a distance between the central axis of the semiconductor pillar and the central axis of the nearest partitioning member.

2. A semiconductor memory device, comprising:
a substrate;
a stacked body provided on the substrate, and including a plurality of electrode films and a plurality of insulating films, each of the plurality of electrode films and each of the plurality of insulating films being alternately stacked along a first direction;
a semiconductor pillar provided in the stacked body, and extending in the first direction of the plurality of electrode films;
a memory film provided between the semiconductor pillar and the plurality of electrode films;
a partitioning member provided in the stacked body;
a first interlayer insulating film provided on the stacked body; and
a first plug provided in the first interlayer insulating film;
a second interlayer insulating film provided on the first interlayer insulating film;
a second plug provided in the second interlayer insulating film; and
a first wiring connected to the second plug,
the first plug being connected to the semiconductor pillar,
the second plug being connected to the first plug,
a central axis of the second plug being shifted from a central axis of the first plug, and
a distance between the central axis of the second plug and a central axis of a nearest partitioning member being smaller than a distance between the central axis of the first plug and the central axis of the nearest partitioning member.

3. The device according to claim 1, further comprising:
a second interlayer insulating film provided on the first interlayer insulating film;
a second plug provided in the second interlayer insulating film; and
a first wiring connected to the second plug, wherein
a central axis of the second plug is shifted from the central axis of the first plug, and
a distance between the central axis of the second plug and the nearest partitioning member is smaller than a distance between the central axis of the first plug and the nearest partitioning member.

4. The device according to claim 1, wherein
the semiconductor pillar provides in plural numbers in the stacked body,
the partitioning member provides in plural numbers in the stacked body, the plurality of partitioning members arranged along a second direction crossing the first direction, and the plurality of semiconductor pillars are disposed in a staggered form along a third direction crossing the first direction and the second direction between two adjacent partitioning members of the plurality of partitioning members.

5. The device according to claim 1, wherein
the semiconductor pillar provides in plural numbers in the stacked body,
the partitioning member provides in plural numbers in the stacked body, the plurality of partitioning members arranged along a second direction crossing the first direction, and
the partitioning member is in the form of a line extending in a third direction crossing the first direction and the second direction, and
in a region between the two adjacent partitioning members, when m (m is an integer not less than two) is a number of the semiconductor pillars arranged in second direction and F is a pitch, a pitch of the first plugs in the second direction is [F(m+1)/m].

6. The device according to claim 1, further comprising:
an insulating film provided on the substrate;
a back gate electrode provided on the insulating film;
a connection member;
a bit line; and
a source line, wherein
the semiconductor pillar provides at least two numbers in the stacked body,
the partitioning member provides at least two numbers in the stacked body, the partitioning members arrange along a second direction crossing the first direction,
the connection member provides in the back gate electrode and mutually connecting individual lower end parts of the two adjacent semiconductor pillars with the partitioning member interposed therebetween,
the bit line connects to an upper end of one semiconductor pillar of the two semiconductor pillars,
the source line connects to an upper end of the other semiconductor pillar of the two semiconductor pillars, and
the stacked body is disposed on the back gate electrode and the connection member.

7. The device according to claim 1, further comprising:
a connection member provided on the substrate and containing a semiconductor material, wherein
the semiconductor pillar and the partitioning member are connected to the connection member.

8. The device according to claim 1, wherein
the partitioning member is a conductive member, and
the device further comprises a side wall insulating film covering a side surface of the partitioning member.

9. The device according to claim 7, wherein
the partitioning member is a conductive member, and
the device further comprises a side wall insulating film covering a side surface of the partitioning member.

10. A semiconductor memory device, comprising:
a substrate;
a stacked body provided on the substrate, and including a plurality of electrode films and a plurality of insulating films, each of the plurality of electrode films and each of the plurality of insulating films being alternately stacked;
a plurality of semiconductor pillars penetrating through the stacked body in a first direction;
a memory film provided between the semiconductor pillar and the plurality of electrode films;
a first partitioning member provided between the plurality of semiconductor pillars and in the stacked body,
a first interlayer insulating film provided on the stacked body; and
a plurality of first plugs provided in the first interlayer insulating film, the plurality of first plugs including a two of first plugs arranged in a second direction crossing the first direction,
the first partitioning member located between the two of first plugs in the second direction,
the plurality of first plugs being connected to each of the semiconductor pillars, and
a distance between a central axis corresponding to each of the two of first plugs being shorter than a distance between a central axis corresponding to each of the semiconductor pillars corresponding to each of the two of first plugs.

11. The device according to claim 10, wherein
the two of first plugs are shifted from the semiconductor pillar so as to approach the first partitioning member.

12. The device according to claim 10, further comprising:
a second interlayer insulating film provided on the first interlayer insulating film;
a plurality of second plugs provided in the second interlayer insulating film, the plurality of second plugs including a two of second plugs;
the plurality of second plugs being connected to each of the plurality of first plugs, the two of second plugs being connected to each of the two of the first plugs, and
a distance between the two of second plugs being shorter than a distance between the plurality of semiconductor pillars corresponding each of the two of first plugs.

13. The device according to claim 10, further comprising:
a second partitioning member in the stacked body, a second partitioning member arranged with the first partitioning member along the second direction; and
the semiconductor pillars are disposed in a staggered form along a third direction crossing the first direction and the second direction between the first partitioning member and the second partitioning member.

14. The device according to claim 10, further comprising:
a second partitioning member in the stacked body, the second partitioning member arranged with the first partitioning member along a second direction crossing the first direction, wherein
the first partitioning member and the second partitioning member are in the form of a line extending in a third direction crossing the first direction and the second direction, and
in a region between the first partitioning member and the second partitioning member, when m (m is an integer not less than two) is a number of the semiconductor pillars arranged in the second direction and F is a pitch, a pitch of the plurality of first plugs in the second direction is [F(m+1)/m].

15. The device according to claim 10, further comprising:
a second partitioning member in the stacked body, the second partitioning member arranged with the first partitioning member along a second direction crossing the first direction,
an insulating film provided on the substrate;
a back gate electrode provided on the insulating film;
a connection member provided in the back gate electrode and mutually connecting individual lower end parts of the two adjacent semiconductor pillars located between the first partitioning member and the second partitioning member;
a bit line connected to an upper end of one semiconductor pillar of the two semiconductor pillars; and
a source line connected to an upper end of the other semiconductor pillar of the two semiconductor pillars, wherein
the stacked body is disposed on the back gate electrode and the connection member.

16. The device according to claim 10, further comprising:
a connection member provided on the substrate and containing a semiconductor material, wherein
the semiconductor pillar and the partitioning member are connected to the connection member.

17. The device according to claim 10, wherein
the first partitioning member is a conductive member, and
the device further comprises a side wall insulating film covering a side surface of the first partitioning member.

18. A semiconductor memory device, comprising:
a substrate;
a stacked body provided on the substrate, and including a plurality of electrode films and a plurality of insulating films, each of the plurality of electrode films and each of the plurality of insulating films being alternately stacked;
a semiconductor pillar provided in the stacked body, and extending in a stacking direction of the plurality of electrode films;
a memory film provided between the semiconductor pillar and the plurality of electrode films;
a partitioning member provided in the stacked body;
a first interlayer insulating film provided on the stacked body; and
a first plug provided in the first interlayer insulating film, the first plug being connected to a top surface of the semiconductor pillar,
a distance between a central axis of the first plug and a central axis of the partitioning member being smaller than a distance between a central axis of the top surface of the semiconductor pillar and the central axis of the partitioning member.

19. The device according to claim 18, further comprising:
a second interlayer insulating film provided on the first interlayer insulating film;
a second plug provided in the second interlayer insulating film, and connected to the first plug; and
a first wiring connected to the second plug,
a distance between a central axis of the second plug and the partitioning member being smaller than the distance between the central axis of the top surface of the semiconductor pillar and the partitioning member.

20. The device according to claim 18, further comprising:
a second interlayer insulating film provided on the first interlayer insulating film;
a second plug provided in the second interlayer insulating film, and connected to the first plug; and
a first wiring connected to the second plug,
a distance between a central axis of the second plug and the partitioning member being smaller than the distance between the central axis of the first plug and the partitioning member.

21. A semiconductor memory device, comprising:
a stacked body including a plurality of electrode films and a plurality of insulating films, each of the plurality of electrode films and each of the plurality of insulating films being alternately stacked in a first direction;
a first partitioning member provided in the stacked body;
a second partitioning member provided in the stacked body, the second partitioning member arranged with the first partitioning member in a second direction crossing the first direction;
a first semiconductor pillar provided in the stacked body, and extending in the first direction, the first semiconductor pillar located between the first partitioning member and the second partitioning member;
a second semiconductor pillar provided in the stacked body, and extending in the first direction, the second semiconductor pillar located between the first partitioning member and the second partitioning member in the second direction, and arranged with the first semiconductor pillar in a third direction crossing the first direction and the second direction;
a third semiconductor pillar provided in the stacked body, and extending in the first direction, the third semiconductor pillar located between the first partitioning member and first semiconductor pillar in the second direction, and located between the first semiconductor pillar and second semiconductor pillar in the third direction;
a first plug provided on the first semiconductor pillar, and being connected with the first semiconductor pillar;
a second plug provided on the second semiconductor pillar, and being connected with the second semiconductor pillar; and
a third plug provided on the third semiconductor pillar, and being connected with the third semiconductor pillar; wherein
a first distance between a central axis of the first semiconductor pillar and a central axis of the second partitioning member is larger than a second distance between a central axis of the first plug and the central axis of the second partitioning member,
a third distance between a central axis of the second semiconductor pillar and the central axis of the second partitioning member is larger than a fourth distance between a central axis of the second plug and the central axis of the second partitioning member,
a fifth distance between a central axis of the third semiconductor pillar and a central axis of the first partitioning member is larger than a sixth distance between a central axis of the third plug and the central axis of the first partitioning member.

22. The device according to claim 21, further comprising:
a fourth plug provided on the first plug, and being connected with the first plug;
a fifth plug provided on the second plug, and being connected with the second plug;
a sixth plug provided on the third plug, and being connected with the third plug;
the second distance is larger than a seventh distance between a central axis of the fourth plug and the second partitioning member,
the fourth distance is larger than an eighth distance between a central axis of the fifth plug and the second partitioning member,
the third distance is larger than a ninth distance between a central axis of the sixth plug and the first partitioning member.

* * * * *